United States Patent
Perlov et al.

(10) Patent No.: US 7,678,626 B2
(45) Date of Patent: Mar. 16, 2010

(54) METHOD AND SYSTEM FOR FORMING A THIN FILM DEVICE

(75) Inventors: Craig M. Perlov, Palo Alto, CA (US); Ping Mei, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 906 days.

(21) Appl. No.: 11/285,879

(22) Filed: Nov. 23, 2005

(65) Prior Publication Data

US 2007/0117278 A1    May 24, 2007

(51) Int. Cl.
    *H01L 21/8234* (2006.01)
(52) U.S. Cl. .................. 438/158; 438/164; 438/585; 257/347; 257/E21.414
(58) Field of Classification Search .......... 438/142, 438/626, 631, 645, 151–166, 585; 257/66–72, 257/347, E21.414
See application file for complete search history.

(56) References Cited

U.S. PATENT DOCUMENTS

| 6,861,365 | B2 | 3/2005 | Taussig et al. |
| 6,887,792 | B2 | 5/2005 | Perlov et al. |
| 2002/0022124 | A1* | 2/2002 | Ruoff .......................... 428/325 |
| 2002/0030779 | A1* | 3/2002 | Takahashi et al. ........... 349/139 |
| 2003/0134487 | A1* | 7/2003 | Breen et al. ................. 438/455 |
| 2004/0002216 | A1* | 1/2004 | Taussig et al. .............. 438/694 |
| 2004/0140566 | A1* | 7/2004 | Jeong et al. ................. 257/764 |
| 2004/0222415 | A1* | 11/2004 | Chou et al. ................... 257/40 |
| 2004/0232495 | A1* | 11/2004 | Saito et al. .................. 257/382 |
| 2005/0176182 | A1* | 8/2005 | Me et al. ..................... 438/149 |

FOREIGN PATENT DOCUMENTS

JP        2004241397 A    *    8/2004

OTHER PUBLICATIONS

R.L. Hoffman, B.J. Norris and J.F. Wager ZnO-based transparent thin-film transistors, Feb. 3, 2003, Applied Physics Letters, vol. 82 No. 5, pp. 733-735.*

* cited by examiner

*Primary Examiner*—Steven J Fulk

(57) ABSTRACT

A method of forming a thin film device on a flexible substrate is disclosed. The method includes depositing an imprintable material over the flexible substrate. The imprintable are stamped material forming a three-dimensional pattern in the imprintable material. A sacrificial layer is formed over the three-dimensional pattern. A conductive layer is deposited over the sacrificial layer. The sacrificial layer is removed, leaving portions of the conductive layer as defined by the three-dimensional pattern.

19 Claims, 20 Drawing Sheets

METHOD AND SYSTEM FOR FORMING A THIN FILM DEVICE

FIELD OF THE INVENTION

The invention relates generally to semiconductor processing. More particularly, the invention relates to an apparatus and method for devices formed on a substrate.

BACKGROUND OF THE INVENTION

Traditionally, thin film devices have been formed through processes such as photolithography. In a photolithographic process, a substrate is provided and at least one material layer is uniformly deposited upon the substrate. A photo-resist layer, also commonly known simply as photoresist, or even resist, is deposited upon the material layer, typically by a spin coating machine. A mask is then placed over the photoresist and light, typically ultra-violet (UV) light, is applied through the mask to expose portions of the photoresist. During the process of exposure, the photoresist undergoes a chemical reaction. Generally, the photoresist will react in one of two ways.

With a positive photoresist, UV light changes the chemical structure of the photoresist so that it is soluble in a developer. What "shows" therefore goes, and the mask provides an exact copy of the patterns which are to remain. What remains, can be, for example, the trace lines of a circuit. Photolithography may also be considered a 2D process, in that each layer of material is deposited and then masked. Although 3D structure may be created by stacking layers patterned via the 2D process, there is no inherent alignment feature between the layers.

A negative photoresist behaves in the opposite manner. That is, the UV exposure causes it to polymerize and not dissolve in the presence of a developer. As such, the mask is a photographic negative of the pattern to be left. Following the developing with either a negative or positive photoresist, blocks of photoresist remain. These blocks may be used to protect portions of the original material layer, or serve as isolators or other components.

Photolithography is a precise process applied to small substrates. In part, this small-scale application is due to the high cost of the photo masks. For the fabrication of larger devices, typically, rather than employing a larger and even more costly photo mask, a smaller mask is repeatedly used—a process that requires precise alignment.

As a photolithographic process typically involves multiple applications of materials, repeated masking and etching, issues of alignment between the thin film layers is of high importance. A photolithographic process is not well suited for formation of thin film devices on flexible substrates, where expansion, contraction or compression of the substrate may result in significant misalignment between material layers, thereby leading to inoperable thin film devices. In addition, a flexible substrate is not flat—it is difficult to hold flat during the imprinting process and thickness and surface roughness typically cannot be controlled as well as they can with glass or other non-flexible substrates.

The issue of flatness in photolithography can be a problem because the minimum feature size that can be produced by a given imaging system is proportional to the wavelength of the illumination divided by the numerical aperture of the imaging system. However, the depth of field of the imaging system is proportional to the wavelength of the illumination divided by the square of the numerical aperture. Therefore, as resolution is increased, the flatness of the substrate quickly becomes the critical issue.

It is desirable to have a method and system for formation of thin film devices over a flexible substrate. It is desirable that there not be limitations on the types of material used to form the thin film devices. The method and system should be simple, cost effective and capable of being easily adapted to existing technology.

SUMMARY OF THE INVENTION

The invention includes a method of forming a thin film device on a flexible substrate. The method includes depositing an imprintable material over the flexible substrate. The imprintable material is stamped forming a three-dimensional pattern in the imprintable material. A sacrificial layer is formed over the three-dimensional pattern. A conductive layer is deposited over the sacrificial layer. The sacrificial layer is removed, leaving portions of the conductive layer as defined by the three-dimensional pattern.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 6A through FIG. 5E show steps of an exemplary method of forming a patterned gate electrode.

DETAILED DESCRIPTION

The invention includes a method of forming thin film devices over flexible substrates. The invention further includes methods of forming thin film transistor structures formed over flexible substrates. The following description is presented to enable one of ordinary skill in the art to make and use the invention. Various modifications of the embodiments described herein will be apparent to those skilled in the art. The invention is not to be limited to the embodiments shown but is to be accorded the widest scope consistent with the principles and features described herein. The descriptions herein are directed to the formation of semiconductor devices on a substrate. One of ordinary skill in the art will recognize that methods described can be utilized to form other types of devices (for example, mechanical, optical and biological).

In at least one embodiment, the method for forming at least one thin film device incorporates Self-Aligned Imprint Lithography ("SAIL"), a technique for producing multilayer patterns on flexible substrates. The SAIL technique uses a three dimensional (3D) patterned resist and is typically compatible with roll-to-roll processing. As the 3D resist is flexible, the pattern will stretch or distort to the same degree as the substrate. As such, a SAIL roll-to-roll fabrication process may be employed to provide low cost manufacturing solutions for devices such as flat and/or flexible displays, or other devices suitable for roll-to-roll processing.

Utilizing height differences in an imprinted 3D stamp or other provided 3D structure, multi-level pattern information is provided and self alignment maintained independent of the instability of a flexible substrate. It shall also be realized that the disclosed methods may be employed upon a non-flexible substrate.

Figure 1A:
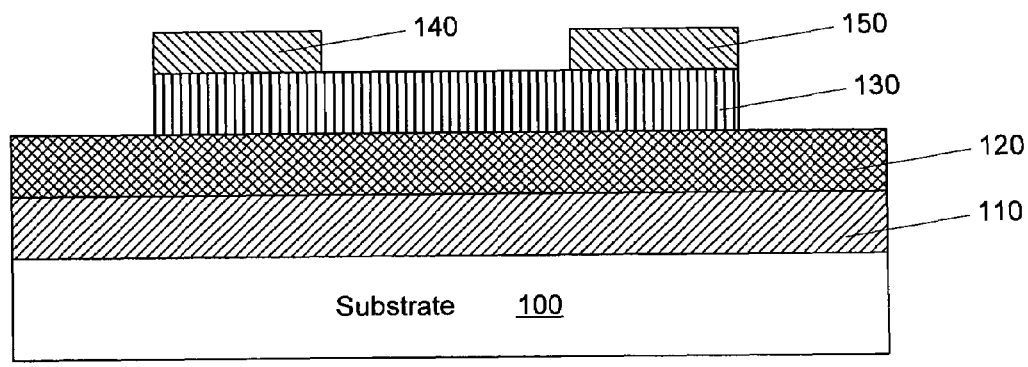
FIG. 1A shows a thin film transistor formed over a flexible substrate.

FIG. 1A shows a thin film transistor (TFT) formed over a substrate 100. The TFT includes a gate conductor 110, a gate dielectric 120, a channel 130 and top conductors 140, 150. This structure is unique because of the types of material that can be used to form, for example, the channel 130 and the top conductors 140, 150.

The materials of the channel 130 and the top conductors 140, 150 can be materials having similar etch chemistry. Due to the close proximity of the channel 130 and the top conductors, the channel 130 and the top conductors 140, 150 cannot be formed by an etch-back process. Alternatively, the materials used to form the thin film device may be resistant to etching, and therefore, cannot be formed by an etch-back process. Exemplary etch resistant material that are desirably used in the formation of thin film transistors include Zinc-Oxides and Zinc-Tin Oxides. For the formation of transparent thin film transistors, is desirable to use an etch resistant Indium-Tin oxide for the drain and source electrodes.

An etch resistant layer (material) can be defined as a material that dissolves at a rate of 1/10 the rate of a non-etch resistant layer. Etch resistant materials do not react to gases or solvents used to remove a sacrificial layer (as will be described).

In at least one embodiment, substrate 100 is a flexible substrate, such as, for example, a polyimide plastic sheet with or without an inorganic coating. Further, substrate 100 may be transparent. In at least one alternative embodiment, substrate 100 is both flexible and transparent, such as polyethylene teraphathalate (PET). In at least one other embodiment, the substrate is rigid, and can be formed from silicon or glass.

The gate 110 is a conductive electrode which can be formed, for example, from Cu, Cr, Al, or TiW. The gate dielectric 120 is typically formed from a dielectric, for example, SiN, $SiO_2$, $Al_2O_3$. The channel 130 is typically formed out of a semiconductor, for example, Si, SiGe, or SiC. The top conductors 140, 150 are source and drain electrodes that can be formed, for example, from Cu, Cr, Al, or TiW.

In fabricating transparent TFTs, a good choice for the channel material is ZnO or a variant of ZnO. A good choice for a transparent conductor is InSnO (ITO). Both of these materials etch in chlorine chemistry. If place side-by-side, one cannot be etched without damaging the other.

Other attempts to fabricate TFTs using common types of materials have used either shadow masks or various standard forms of lithography. None of these processes are compatible with fabricating high precision, low cost parts in a roll-to-roll environment in which flexible substrates are utilized. Additionally, previous attempts to fabricate thin film devices on flexible substrates have had limitations on the materials that can be used to form the thin film devices.

Figure 1B:
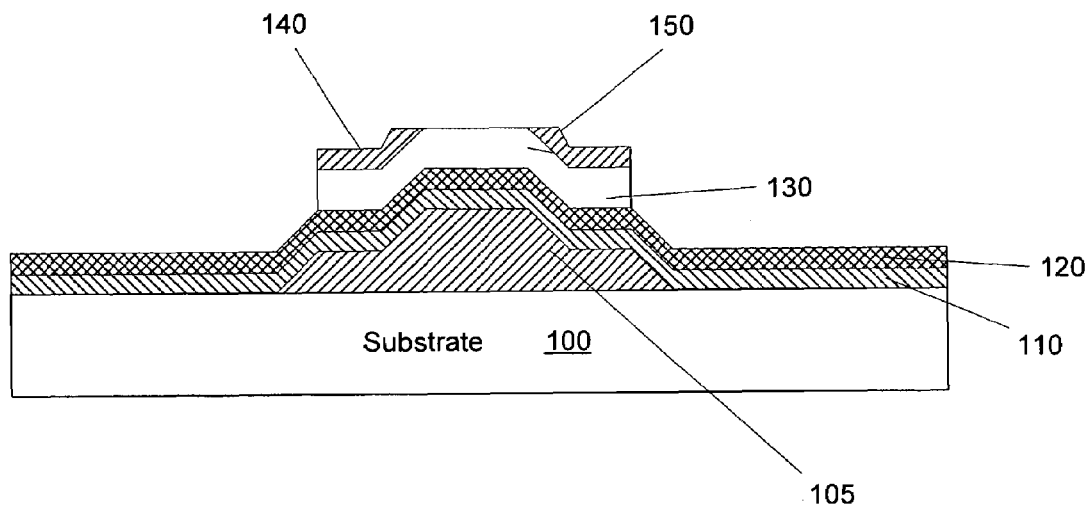
FIG. 1B shows another thin film transistor formed over a flexible substrate.

FIG. 1B shows another thin film device formed over a flexible substrate. As will be described, this structure can be formed using similar processing steps as the structure of FIG. 1A. This structure includes additional patterning of the top conductors 140, 150. The primary difference between the processing of this structure and the structure of FIG. 1A, is the sequence of the imprinting step.

Figure 1C:
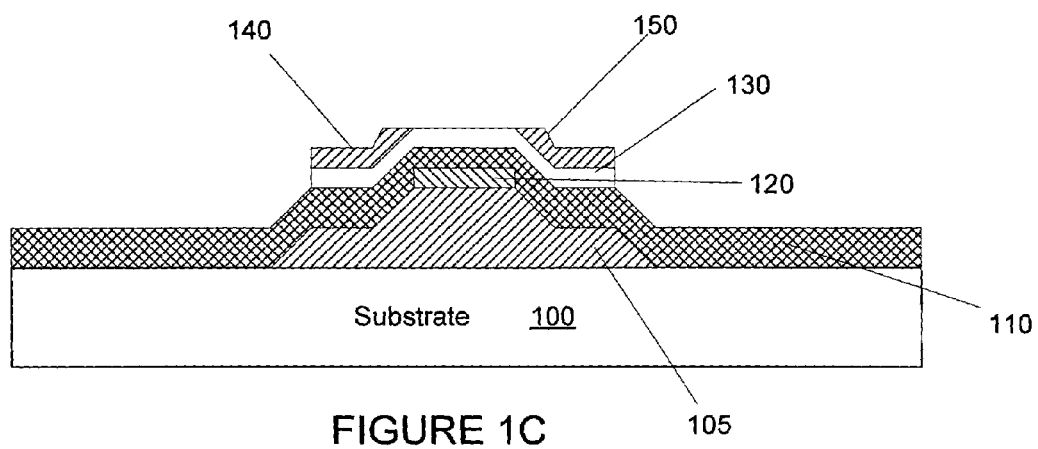
FIG. 1C shows another thin film transistor formed over a flexible substrate.

FIG. 1C shows another thin film device formed over a flexible substrate. This thin film device includes a patterned gate electrode. As will be described, the formation of this structure includes gate electrode 120, the top electrodes 140, 150 and the channel 130 being formed through the use of sacrificial layers rather than through an etch back process.

Figure 1D:
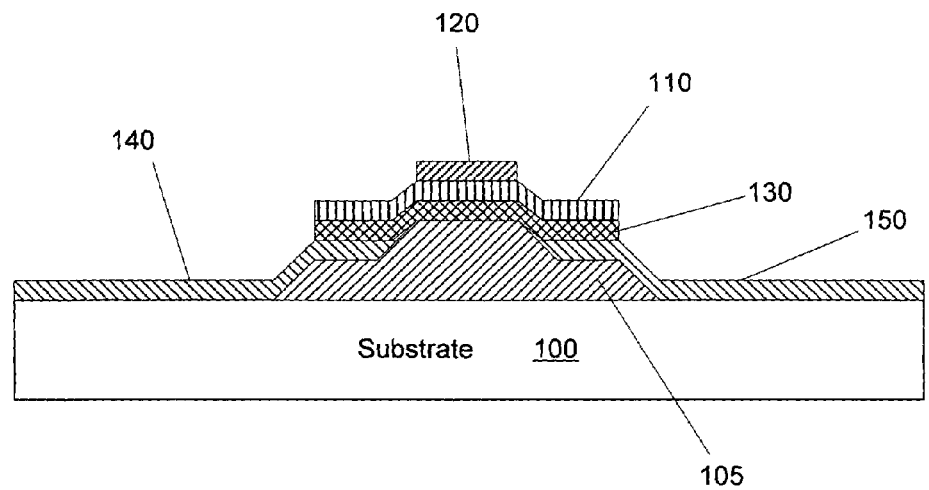
FIG. 1D shows another thin film transistor formed over a flexible substrate.

FIG. 1D shows another thin film transistor formed over a flexible substrate. This thin film device includes the gate electrode 120 being formed on the top-side of the thin film device. This structure is provided as an example of an additional structure that can be formed by the processing steps described. The processing steps for this structure are not shown, but are obvious to one skilled in the art in light of the description of the processes used to form the structures of FIGS. 1A, 1B, 1C.

Figure 2:
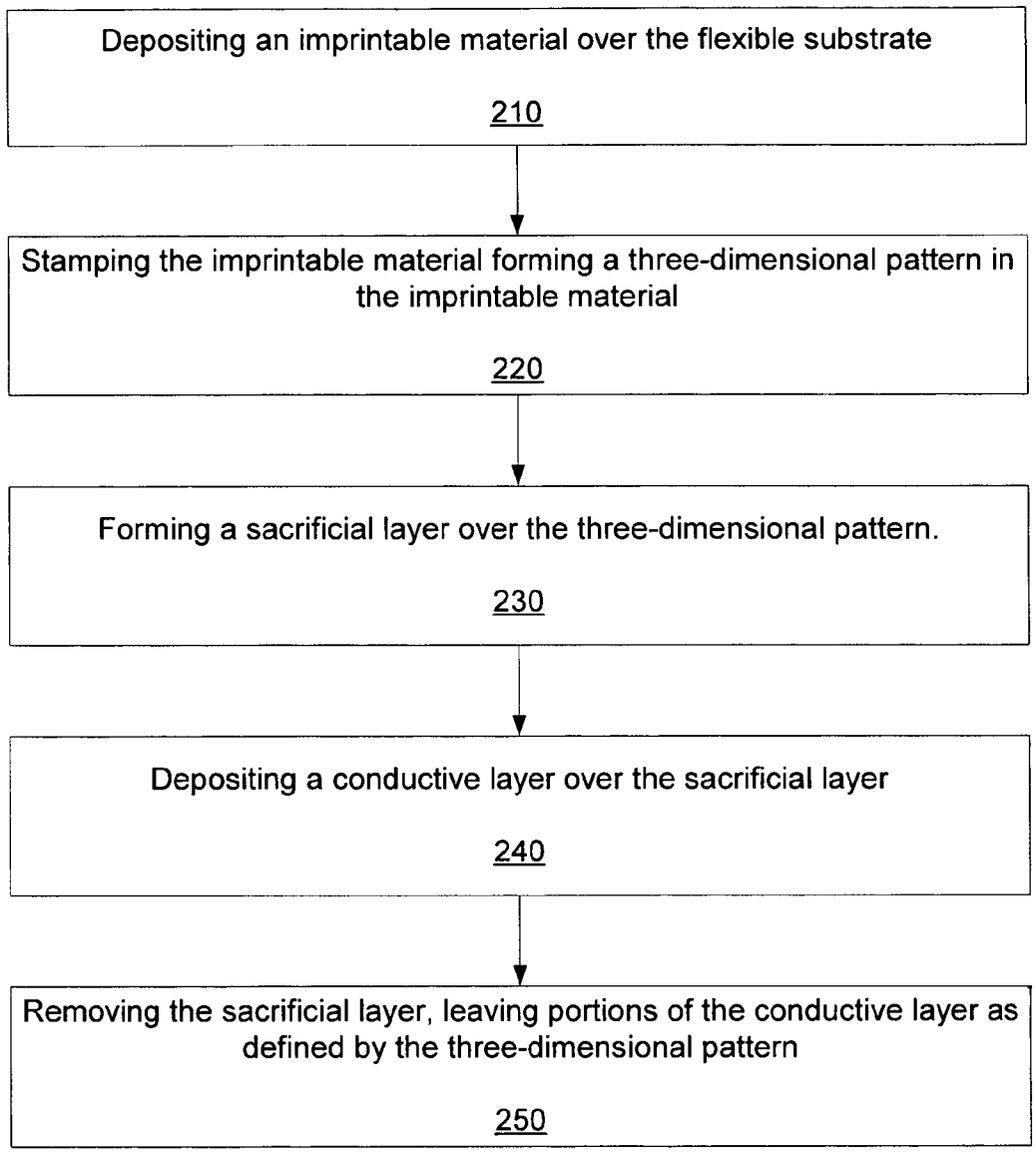
FIG. 2 is a high-level flow chart that includes exemplary steps of a method of forming the structures of FIGS. 1A, 1B, 1C, 1D.

FIG. 2 is a high-level flow chart that includes exemplary steps of a method of forming the structures of FIGS. 1A, 1B, 1C and 1D. Generally, this process provides for the formation of transparent TFTs on flexible substrates. A first step 210 includes depositing an imprintable material over the flexible substrate. A second step 220 includes stamping the imprintable material forming a three-dimensional pattern in the imprintable material. A third step 230 includes forming a sacrificial layer over the three-dimensional pattern. A fourth step 240 includes depositing a conductive layer over the sacrificial layer. A fifth step 250 includes removing the sacrificial layer, leaving portions of the conductive layer as defined by the three-dimensional pattern. An exemplary method of removing the sacrificial layer includes dissolving the sacrificial layer. Other methods of removing, however, could be employed.

Figure 3A:
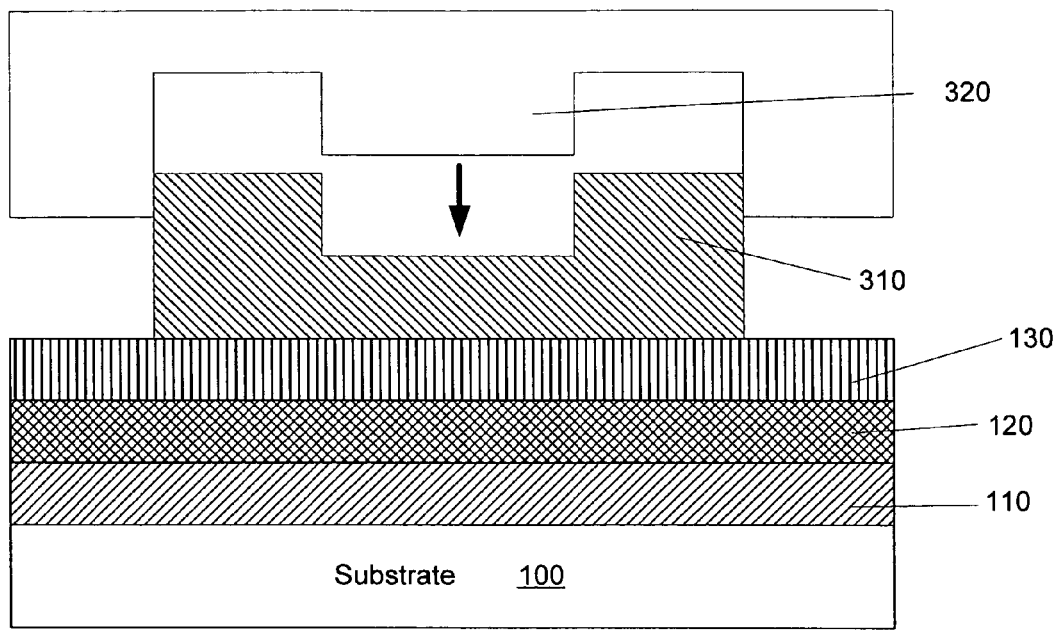
FIG. 3A through FIG. 3H show steps of an exemplary method for forming the thin film transistor of FIG. 1A.

FIG. 3A through FIG. 3H show steps of an exemplary method for forming the thin film transistor of FIG. 1A. FIG. 3A shows a substrate 100 in which a gate electrode layer 110, a gate dielectric 120, a channel layer 130 and an imprintable material 310 have been deposited.

The imprintable material can include any of a variety of commercially available polymers. For example, a polymer from the Norland optical adhesives (NOA) family of polymers can be used. The imprintable material can be deposited by a roll coater in a roll-to-roll process. Alternatively, if the imprintable material is silicon, a spin coater can be used to apply the imprintable material.

FIG. 3A shows a stamp 320 being imprinted in the imprintable material 310. The stamping tool 320 is brought into contact with the imprintable material 310 thereby displacing the imprintable material 310 into the 3-dimensional pattern of the stamping tool 320. One embodiment includes the imprintable material being cured using ultraviolet light or any other suitable means for curing. The ultraviolet curing process requires a light source which directs ultraviolet or visible light onto a formulated liquid. Photoinitiators in the liquid absorb the ultraviolet energy from the light source, setting in motion a chemical reaction that quickly, in fractions of a second, converts the liquid formulation into a solid cured film.

Figure 3B:
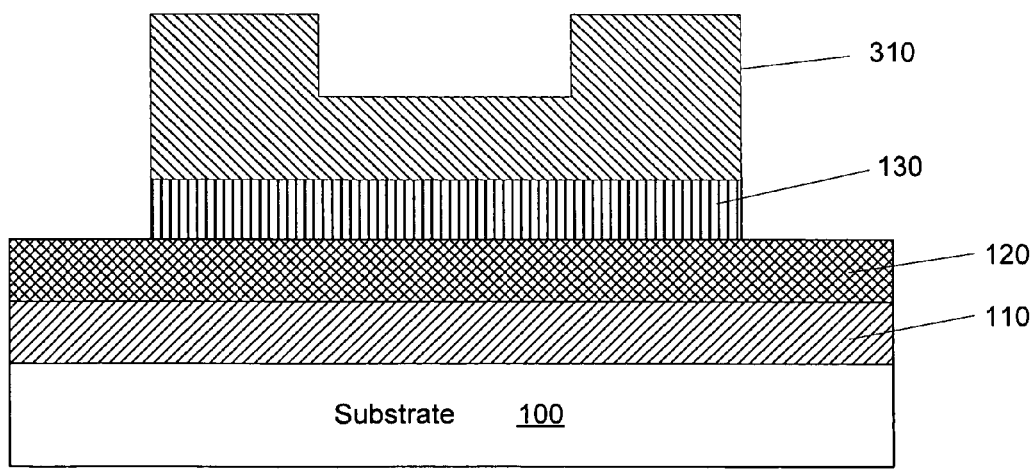

FIG. 3B shows the channel material 130 having been etched where the channel material has been exposed by the imprintable material. An anisotropic reactive ion etch process is typically used to provide a vertical etch that maintains the pattern as established by the 3-dimensional stamp.

Figure 3C:
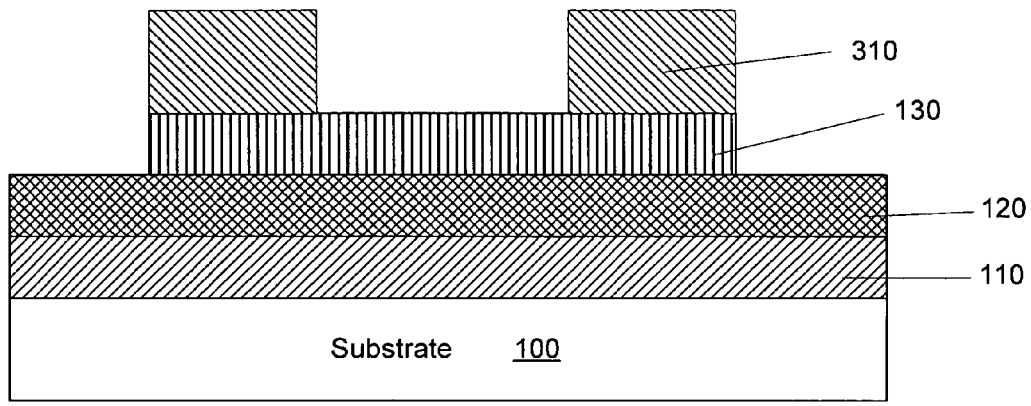

FIG. 3C shows thinning of the imprintable material. The imprintable material is thinned until the channel material 130 is exposed. The process of thinning includes, for example, by an anisotropic reactive ion etch process.

Figure 3D:
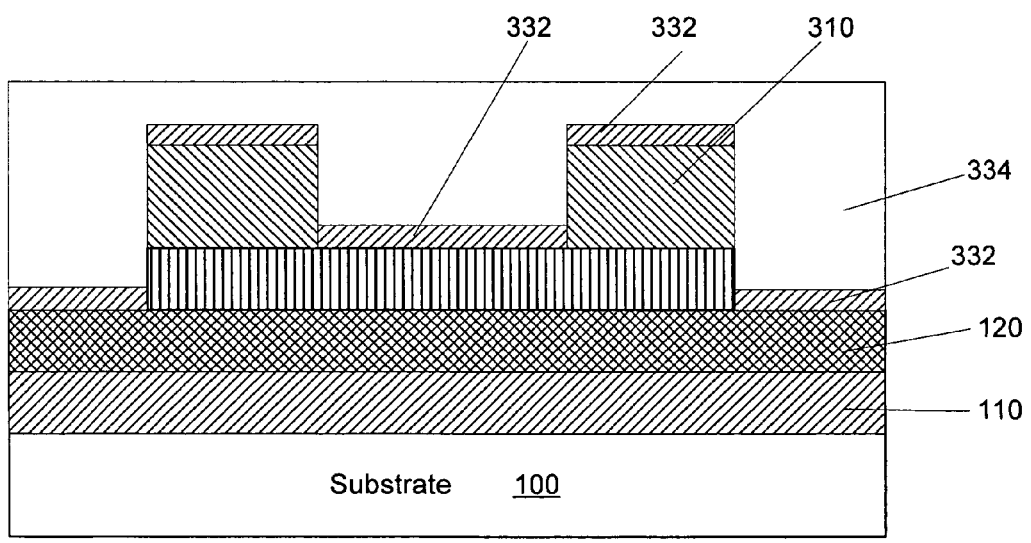

FIG. 3D shows deposition of a sacrificial layer 332, and planarization layer 334. An exemplary sacrificial layer 332 is formed from a polymer, dielectric or even metal. The sacrificial layer 332 includes the material characteristics that allow it to be etched (dissolved) at later processing step without damaging the other layers of the device structure. The planarization can be accomplished, for example, by applying spin on glass, or depositing a photo-resist. The primary function of the planarization layer 334 to is to provide a planar surface.

Figure 3E:
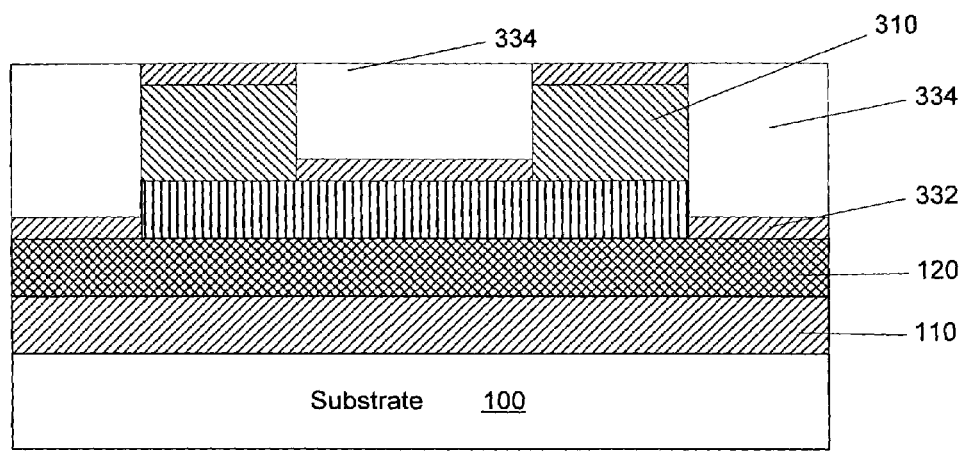

FIG. 3E shows thinning of the planarization layer 334, exposing portions of the sacrificial layer 332. The process of thinning includes, for example, by an anisotropic reactive ion etch process.

Figure 3F:
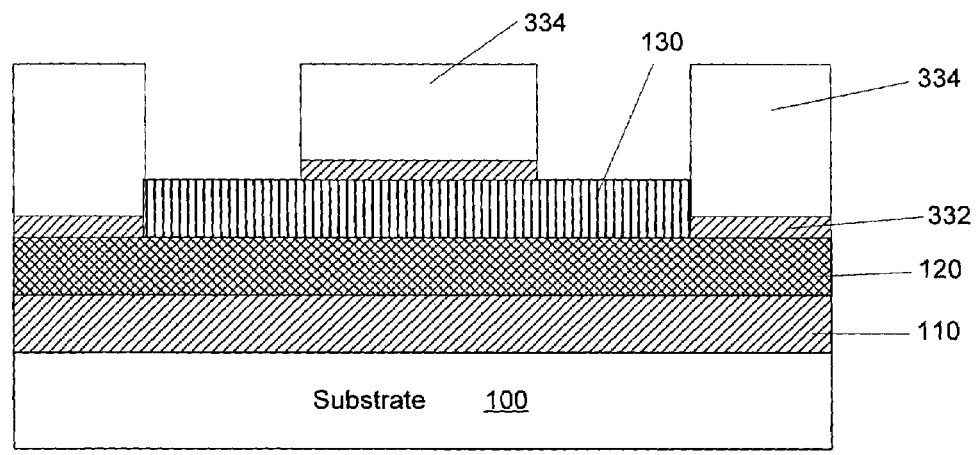

FIG. 3F shows etching of the exposed portions of the sacrificial layer 332 and the corresponding portions of the imprintable material 310. Again, the process of etching includes, for example, by an anisotropic reactive ion etch process.

Figure 3G:
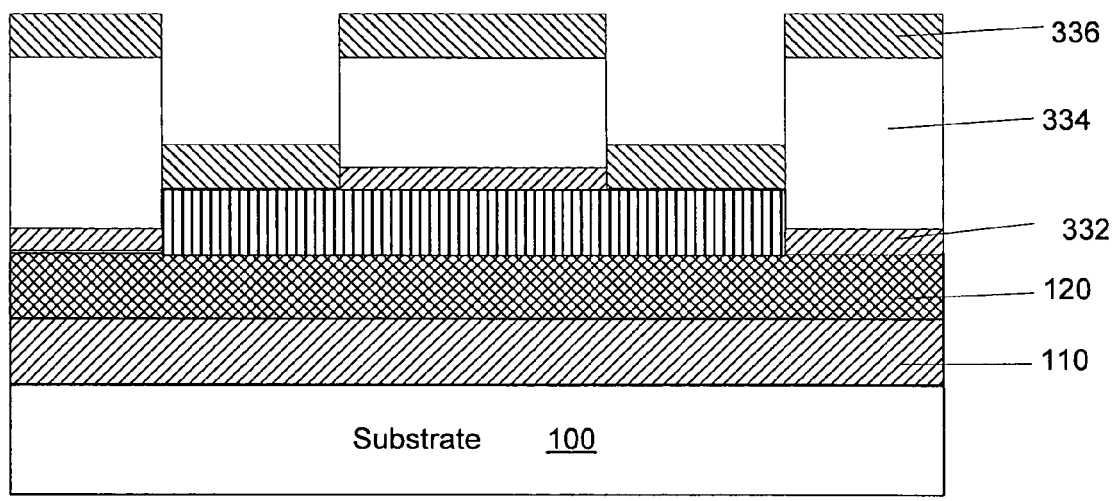

FIG. 3G shows deposition of the top conductor layer 336. A standard semiconductor processing deposition process can be used. As previously stated, the conductor layers include, for example, Cu, Cr, Al, or TiW.

Figure 3H:
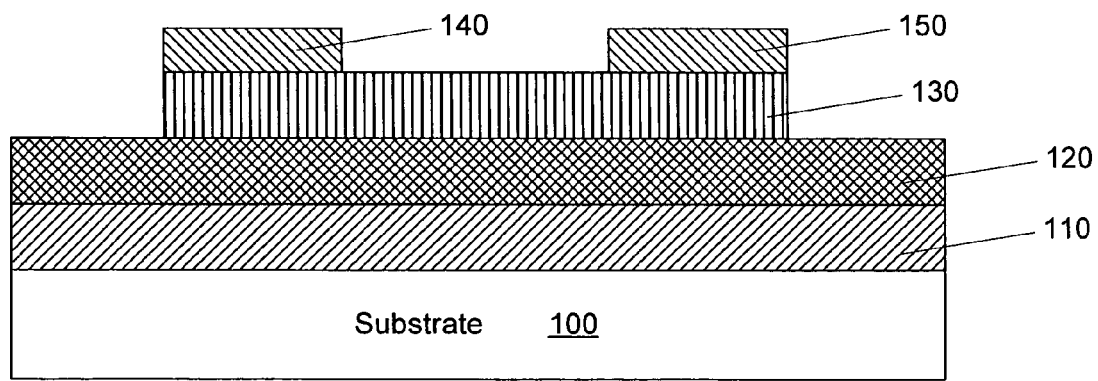

FIG. 3H shows the sacrificial layer 332 being dissolved. The sacrificial layer 332 is dissolved using a process that is to some extent, dependent upon the material used to form the sacrificial layer 332. If the sacrificial layer 332 is formed from a polymer, a solvent can be used to dissolve the sacrificial layer 332. If the sacrificial layer 332 is formed from a dielectric, an acid based solvent can be used to dissolve the sacrificial layer 332. If the sacrificial layer 332 is formed from a metal, an acid based solvent can be used to dissolve the sacrificial layer. The sacrificial layer should be dissolved without damaging the other layers 110, 120, 130, 140, 150 of the thin film device structure.

Figure 4A:
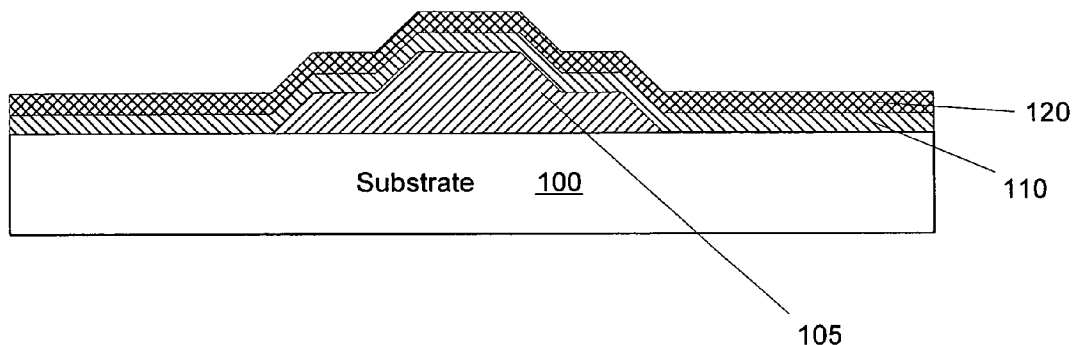
FIG. 4A through FIG. 4N show steps of an exemplary method for forming the thin film transistor of FIG. 1B.
Figure 4B:
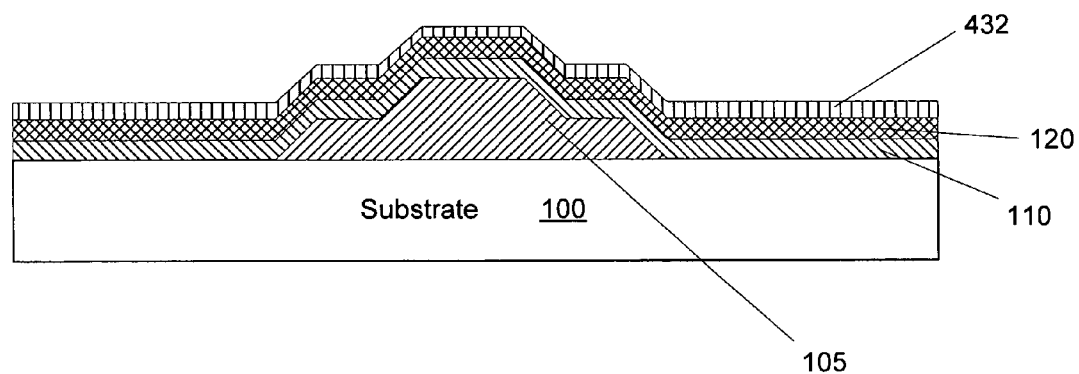
Figure 4C:
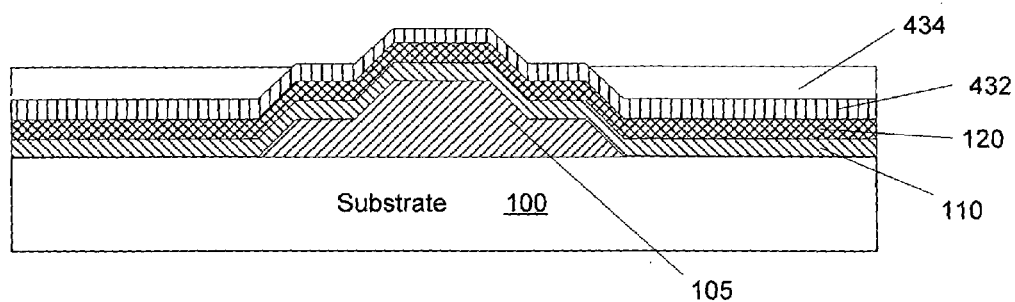
Figure 4D:
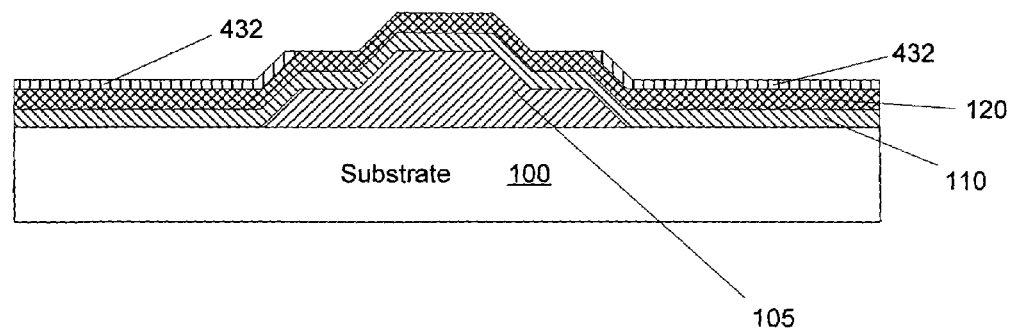
Figure 4E:
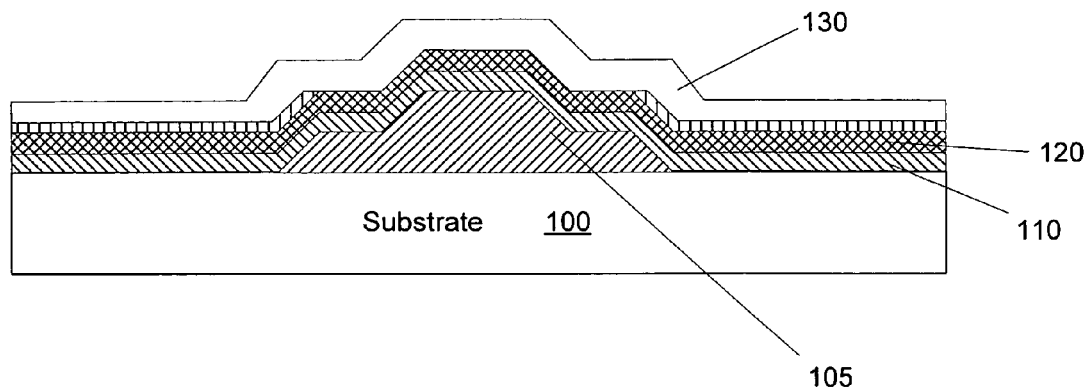
Figure 4F:
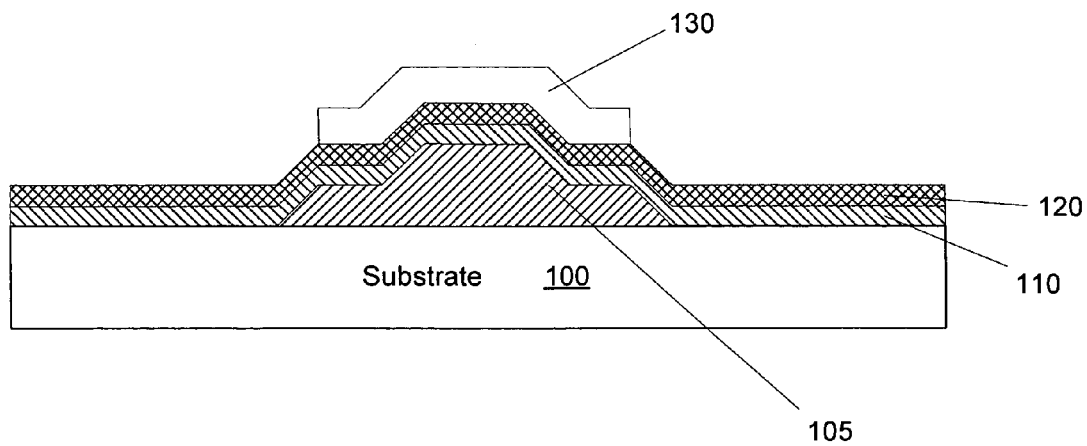
Figure 4G:
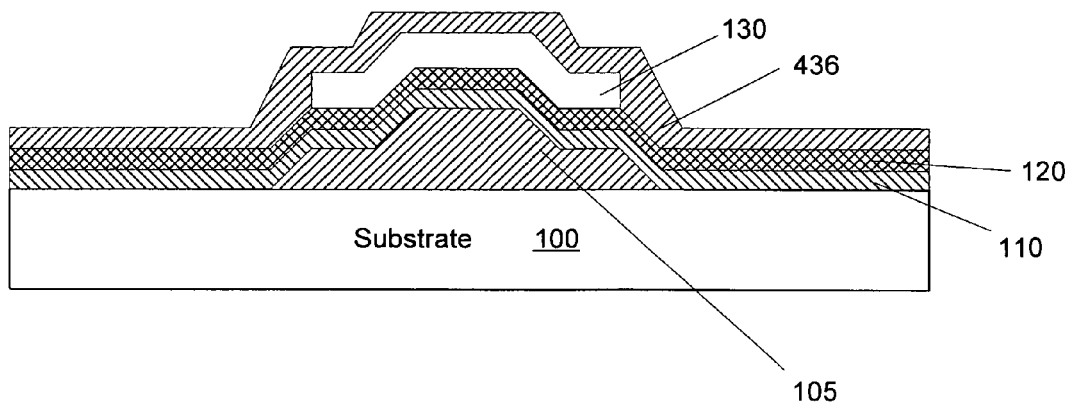
Figure 4H:
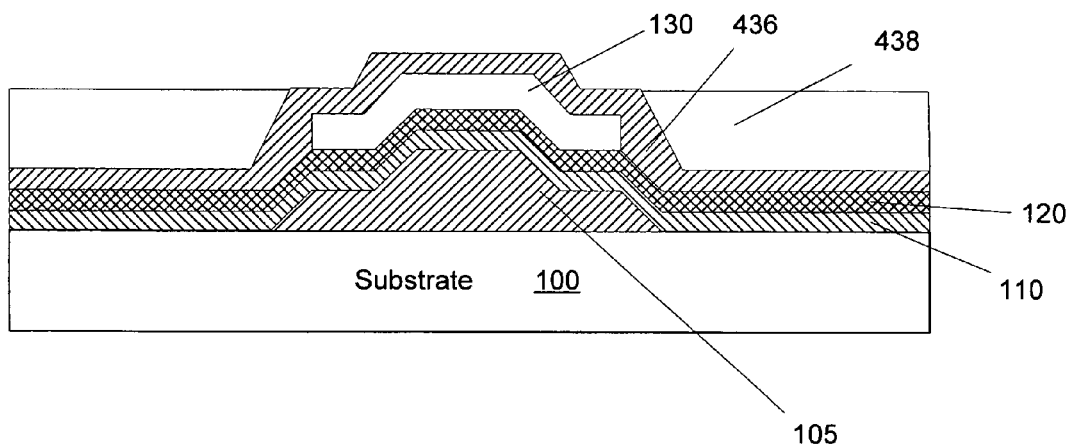
Figure 4I:
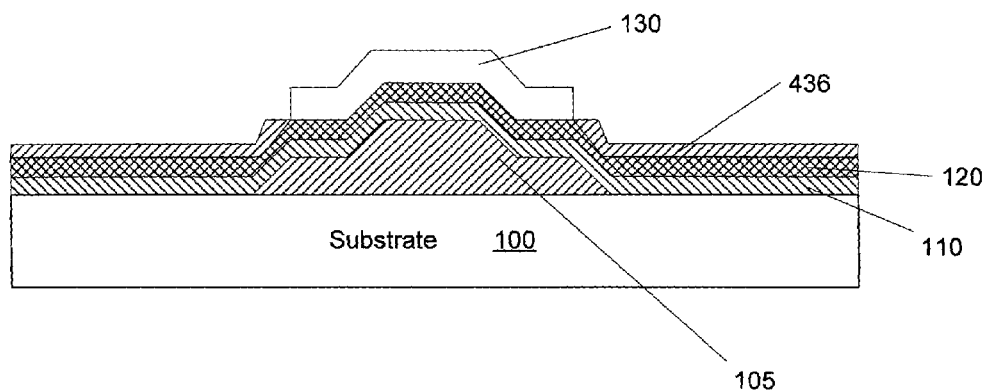
Figure 4J:
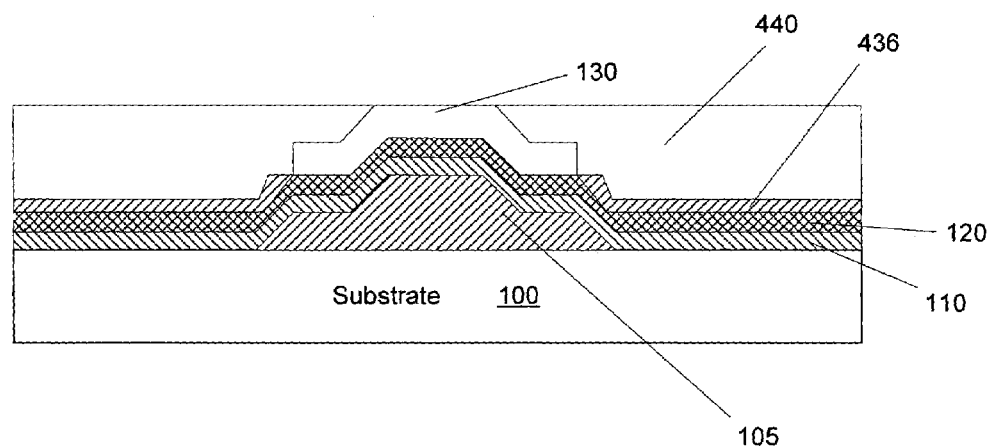
Figure 4K:
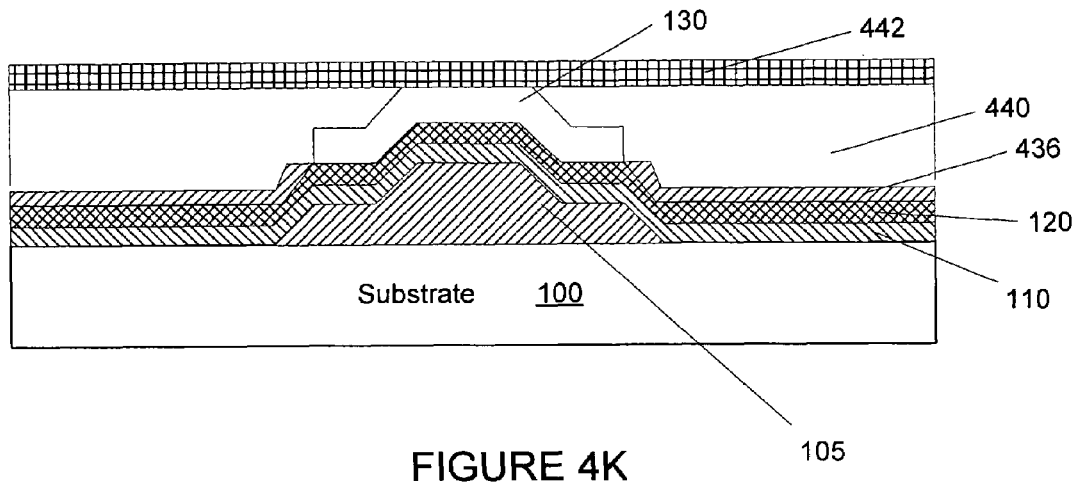
Figure 4L:
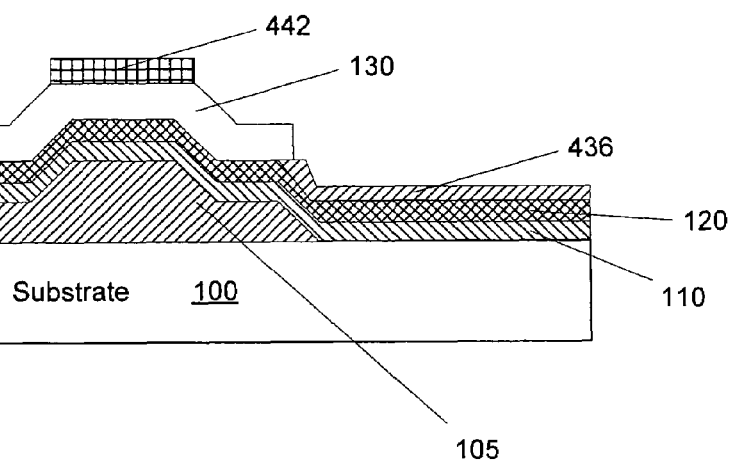
Figure 4M:
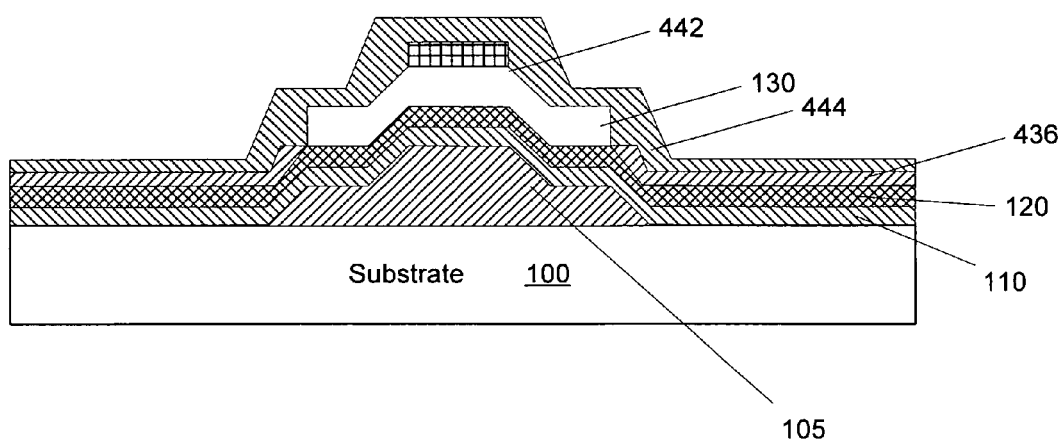
Figure 4N:
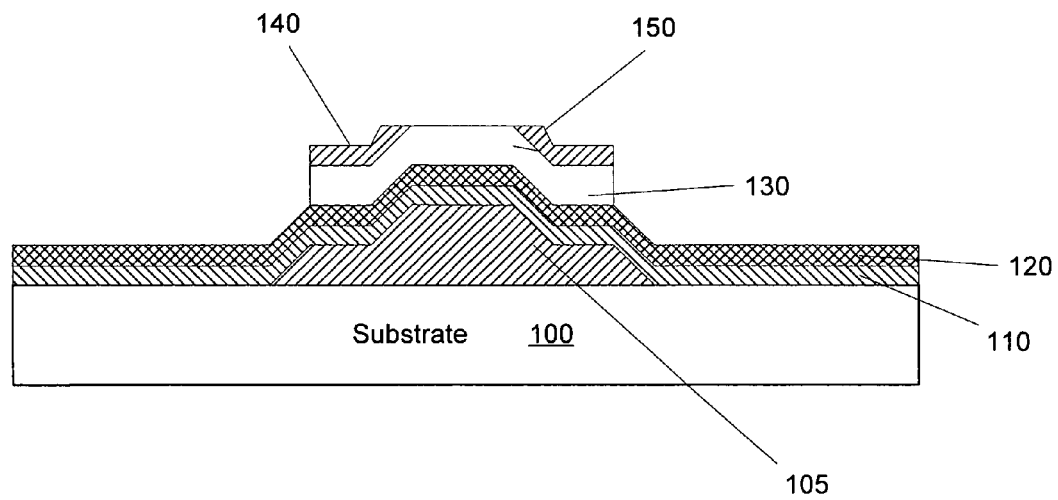

FIG. 4A through FIG. 4N show steps of an exemplary method for forming the thin film transistor of FIG. 1B. The order of the processing steps is slightly different in this embodiment than the last embodiment. For this embodiment, the stamping of the imprintable material occurs before the deposition of the gate electrode layer and the gate dielectric layer. As shown in FIGS. 4A and 1B, the imprintable material 105 includes a three-dimensional profile that is set by three-dimensional stamping of the imprintable material 105.

The substrate 100 includes the three-dimensional imprintable material 105, and a gate electrode layer 110 deposited over the imprintable material 105, and a gate dielectric layer 120 deposited over the gate electrode layer 110. The deposition of the gate electrode layer 110 and the gate dielectric layer 120 are performed by standard semiconductor processing deposition processes.

FIG. 4B shows the deposition of a first sacrificial layer 432. An exemplary first sacrificial layer 432 is formed from a polymer, dielectric or even metal. The first sacrificial layer 432 includes the material characteristics that allow it to be etched (dissolved) at later processing step without damaging the other layers of the device structure.

FIG. 4C shows deposition of a planarization layer 434. The planarization can be accomplished, for example, by applying spin on glass, or depositing a photo-resist. The primary function of the planarization layer 434 to is to provide a planar surface.

FIG. 4D shows the sacrificial layer 432 and planarization layer 434 being etched. As a result, the gate dielectric layer 120 is partially exposed, and portions of the sacrificial layer 432 as defined by the planarization layer 434, are left behind.

FIG. 4E shows deposition of the channel layer 130. The deposition can include a standard semiconductor deposition process.

FIG. 4F shows patterning of the channel layer 130 as defined by dissolving the remaining portions of the first sacrificial layer 332. The sacrificial layer 332 is dissolved using a process that is to some extent, dependent upon the material used to form the sacrificial layer 332. The sacrificial layer should be dissolved without damaging the other layers 110, 120, 130 of the thin film device structure.

FIG. 4G shows the deposition of a second sacrificial layer 436. An exemplary second sacrificial layer 436 is formed from a polymer, dielectric or even metal. The second sacrificial layer 436 includes the material characteristics that allow it to be etched (dissolved) at later processing step without damaging the other layers of the device structure.

FIG. 4H shows deposition of another planariation layer 438. The planarization can be accomplished, for example, by applying spin on glass, or depositing a photo-resist. The primary function of the planarization layer 438 to is to provide a planar surface.

FIG. 4I shows etching of the second sacrificial layer 436 and the planariztion layer 438, leaving patterned portions of the second sacrificial layer 436. Again, the process of etching includes, for example, by an anisotropic reactive ion etch process.

FIG. 4J shows the deposition of another planarization layer 440. The planarization can be accomplished, for example, by applying spin on glass, or depositing a photo-resist. The primary function of the planarization layer 440 to is to provide a planar surface.

FIG. 4K shows the deposition of third sacrificial layer 442. An exemplary third sacrificial layer 442 is formed from a polymer, dielectric or even metal. The third sacrificial layer 442 includes the material characteristics that allow it to be etched (dissolved) at later processing step without damaging the other layers of the device structure.

FIG. 4L shows the planarization layer 440 being dissolved. As shown, a patterned portion of the third sacrificial layer 442 and the patterned portion of the second sacrificial layer 436 are left behind.

FIG. 4M shows the deposition of a conductive layer 444 over the second sacrificial layer 436 and the third sacrificial layer 442. A standard semiconductor processing deposition process can be used. As previously stated, the conductor layer includes, for example, Cu, Cr, Al, or TiW.

FIG. 4N shows the structure of FIG. 1B after dissolving the second sacrificial layer 436 and the third sacrificial layer 442. The portions of the conductive layer 444 left behind form the top conductors 140, 150. The sacrificial layers 436, 442 are dissolved using a process that is to some extent, dependent upon the material used to form the sacrificial layers 436, 442. The sacrificial layers 436, 442 should be dissolved without damaging the other layers 110, 120, 130, 140, 150 of the thin film device structure.

Figure 5A:
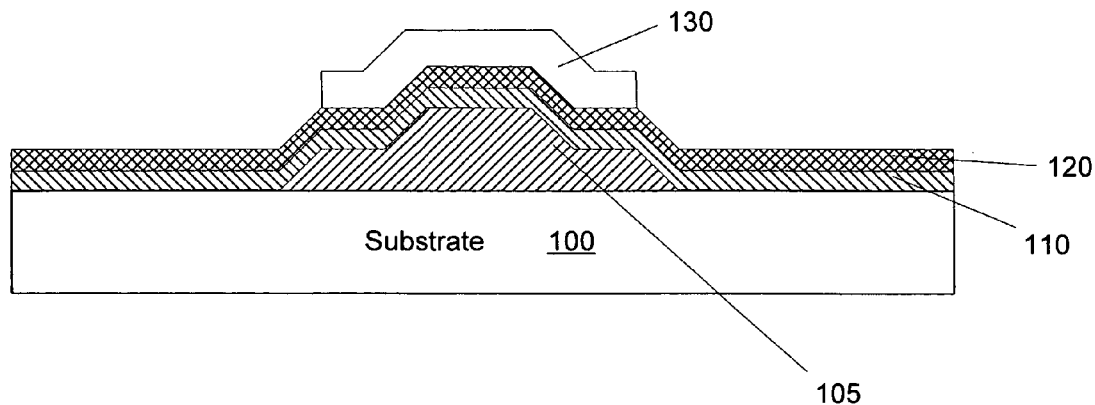
FIG. 5A through FIG. 5F show an alternative set of steps for forming the thin film transistor of FIG. 1B, from the structure of FIG. 4F.

FIG. 5A through FIG. 5E show an alternative set of steps for forming the thin film transistor of FIG. 1B, from the structure of FIG. 4I. FIG. 5A is a duplicate of FIG. 4I, and shows the patterned channel layer 130 over the gate dielectric 120 and the gate conductor 110.

Figure 5B:
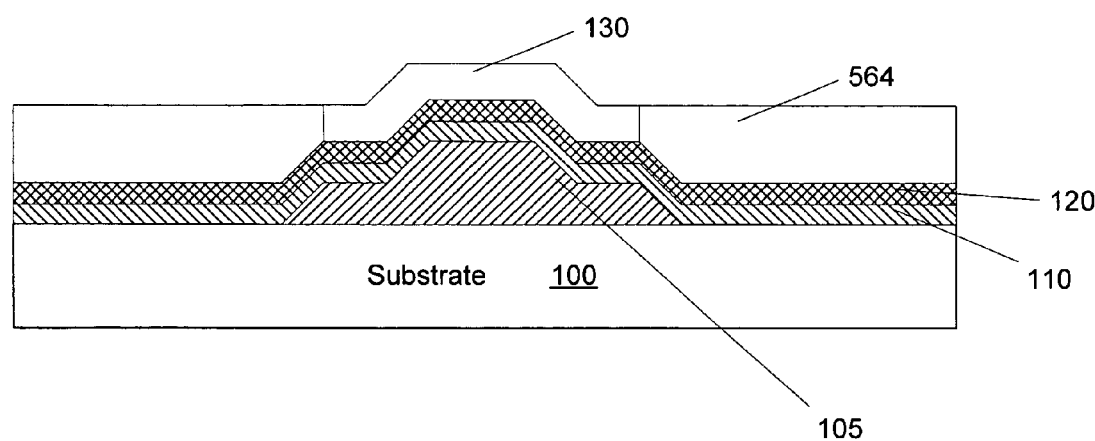

FIG. 5B shows the deposition of a sacrificial layer 564 which is also used as a planarization layer. An exemplary sacrificial layer 564 is formed from a polymer, dielectric or metal. The sacrificial layer 564 includes the material characteristics that allow it to be etched (dissolved) at later processing step without damaging the other layers of the device structure.

Figure 5C:
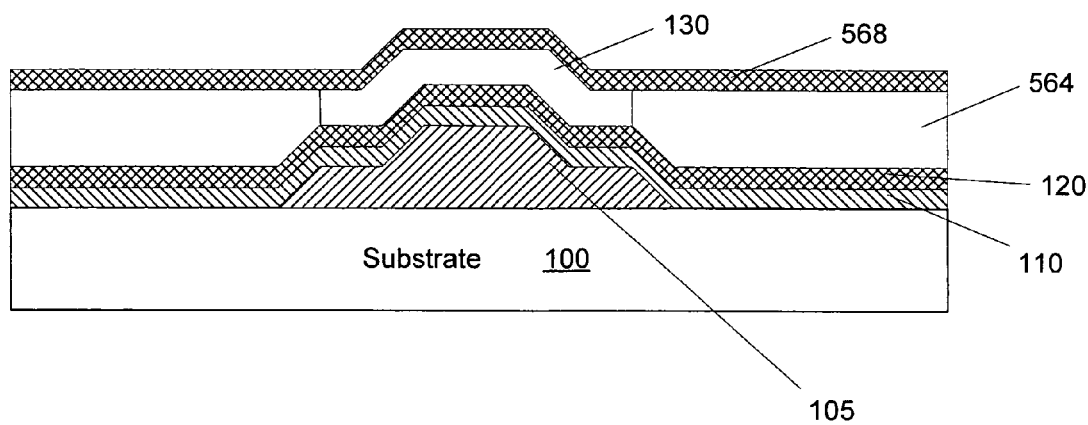

FIG. 5C shows the deposition of a conductive layer 568 which form the basis of the first and second conductors 140, 150. A standard semiconductor processing deposition process can be used. As previously stated, the conductor layer includes, for example, Cu, Cr, Al, or TiW.

Figure 5D:
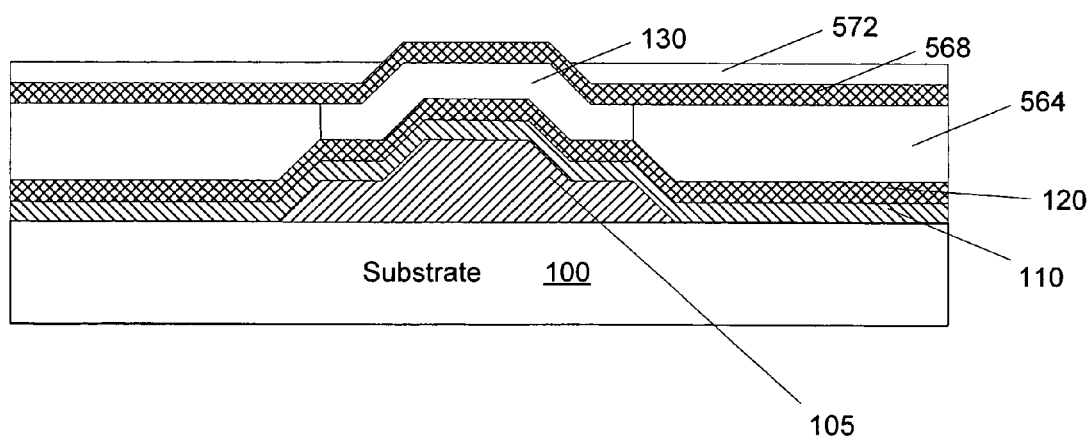

FIG. 5D deposition of a planarization layer 572. The planarization can be accomplished, for example, by applying spin on glass, or depositing a photo-resist. The primary function of the planarization layer 572 to is to provide a planar surface.

Figure 5E:
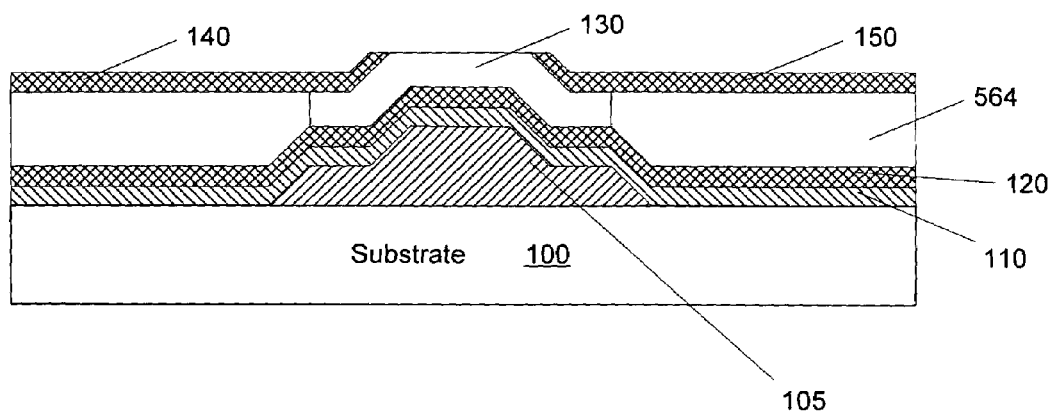

FIG. 5E shows etching of the conductive layer 568 leaving the conductors 140, 150. Again, the process of etching includes, for example, by an anisotropic reactive ion etch process.

Figure 5F:
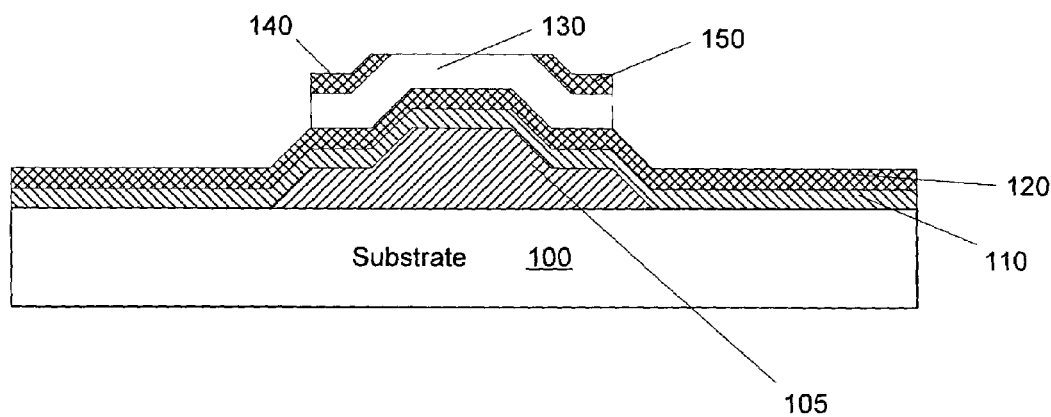

FIG. 5F shows the structure of FIG. 1B after dissolving the sacrificial layer 564. The sacrificial layer 564 is dissolved using a process that is to some extent, dependent upon the material used to form the sacrificial layer 564. The sacrificial layer should be dissolved without damaging the other layers 110, 120, 130, 140, 150 of the thin film device structure.

Figure 6A:
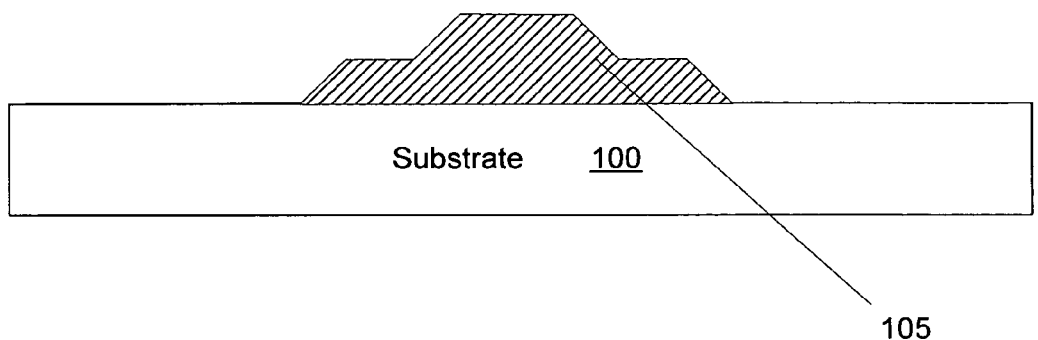

FIG. 6A through FIG. 6E show steps of an exemplary method of forming a patterned gate electrode, as shown in FIG. 1C. FIG. 6A shows a substrate 100 with a three-dimensional imprint material 105. The dimensions of the three-dimensional imprint material are defined by a three-dimensional stamp.

Figure 6B:
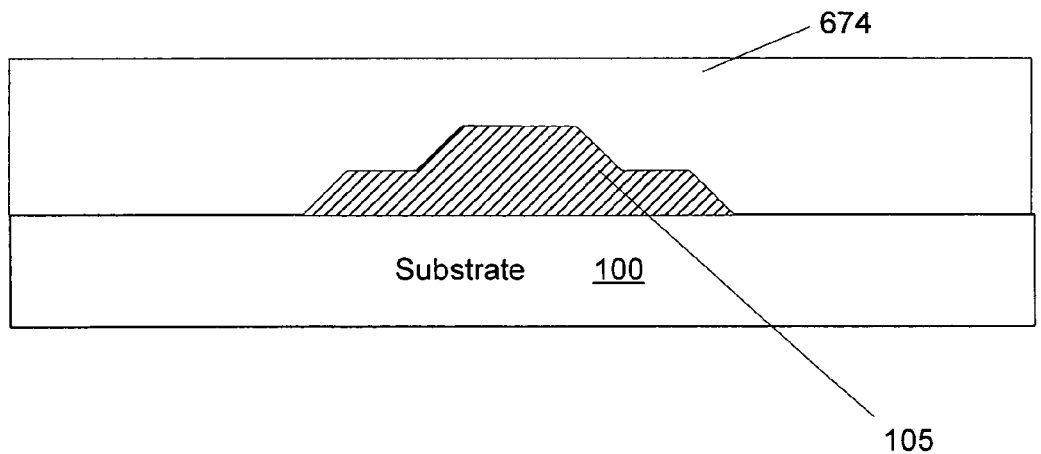

FIG. 6B shows planarization of the three-dimensional layer 105 by deposition of, for example, a planarization polymer 674. The planarization layer layer 674, as will be shown, is actually a sacrificial layer. An exemplary planarization (sacrificial) layer 674 is formed from a polymer, dielectric or even metal. The sacrificial layer 674 includes the material characteristics that allow it to be etched (dissolved) at later processing step without damaging the other layers of the device structure.

Figure 6C:
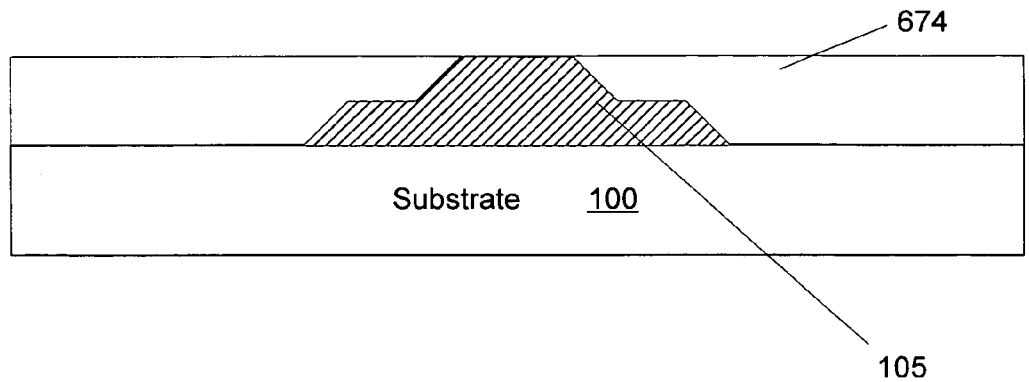

FIG. 6C shows etching of the sacrificial layer 674 exposing a patterned top portion of the three-dimensional layer 105. Again, the process of etching includes, for example, by an anisotropic reactive ion etch process.

Figure 6D:
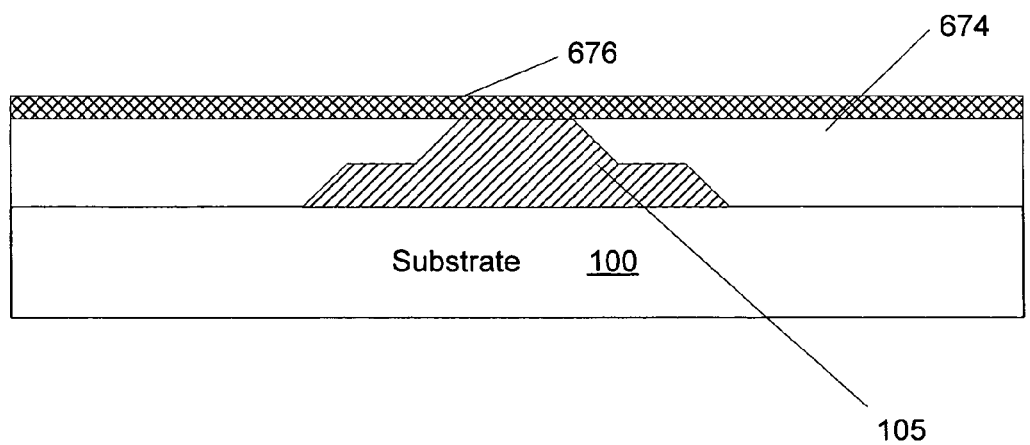

FIG. 6D shows deposition of a gate electrode layer 676 over the sacrificial layer 674 and the top portion of the three-dimensional layer 105. A standard semiconductor processing deposition process can be used. As previously stated, the conductor electrode layer includes, for example, Cu, Cr, Al, or TiW.

Figure 6E:
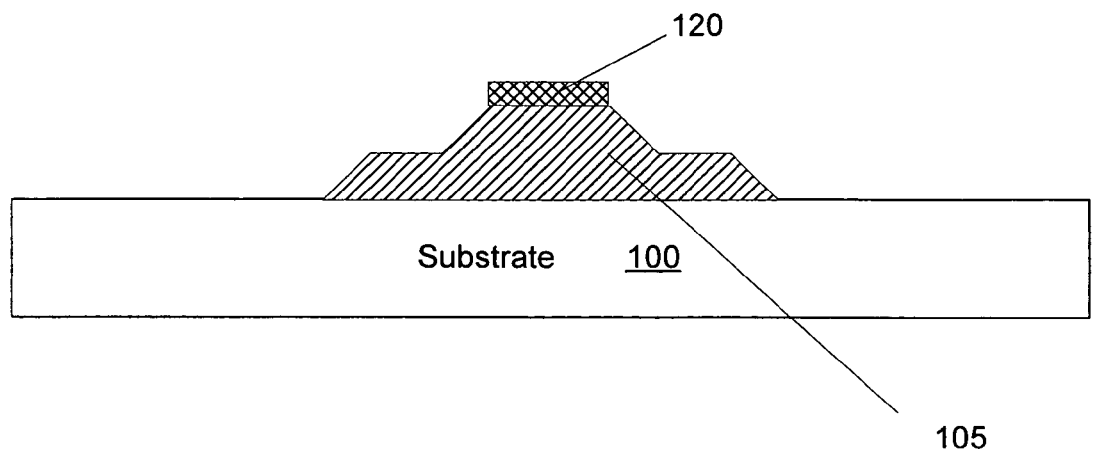

FIG. 6E shows a patterned gate electrode 120 after dissolving the sacrificial layer 674. The sacrificial layer 674 is dissolved using a process that is to some extent, dependent upon the material used to form the sacrificial layer 674. The sacrificial layer 674 should be dissolved without damaging the other layers 100, 105 of the thin film device structure. The structure of FIG. 1C can be formed from the structure of FIG. 6E, by the processing steps shown in FIGS. 4B through 4N.

Although specific embodiments of the invention have been described and illustrated, the invention is not to be limited to the specific forms or arrangements of parts so described and illustrated. The invention is limited only by the appended claims.

What is claimed:

1. A method of forming a thin film device on a substrate, comprising:
   depositing an imprintable material over the substrate;
   stamping the imprintable material forming a three-dimensional pattern in the imprintable material;
   forming a distinct sacrificial layer over the three-dimensional pattern;
   depositing a conductive layer over the distinct sacrificial layer;
   removing the distinct sacrificial layer, leaving portions of the conductive layer as defined by the three-dimensional pattern;
   depositing a gate layer over the substrate;
   depositing a gate dielectric over the gate layer; and
   depositing a channel material over the gate dielectric.

2. The method of claim 1 further comprising:
   etching the channel material before forming the distinct sacrificial layer.

3. The method of claim 1, wherein forming a distinct sacrificial layer comprises:
   depositing a polymer over the three-dimensional pattern;
   thinning the polymer;
   etching the polymer and imprintable material according to the three-dimensional pattern.

4. The method of claim 1, wherein forming a distinct sacrificial layer comprises:
   applying spin on glass over the three-dimensional pattern;
   thinning the glass; etching the glass and
   imprintable material according to the three-dimensional pattern.

5. The method of claim 1, wherein forming a distinct sacrificial layer comprises:
   depositing a polymer over the three-dimensional pattern;
   applying spin on glass over the polymer;
   thinning the glass; etching the polymer and
   imprintable material according to the three-dimensional pattern.

6. The method of claim 1, further comprising:
   depositing the gate layer and the gate dielectric over the three-dimensional patterned imprintable material.

7. The method of claim 6, further comprising forming a patterned gate electrode over the three-dimensional patterned imprintable material before depositing the gate dielectric over the three-dimensional patterned imprintable material.

8. The method of claim 7, further comprising:
   planarizing the three-dimensional patterned imprintable material with a polymer;
   etching the polymer exposing a top portion of the three-dimensional patterned imprintable material;
   depositing a gate electrode over the polymer and exposed top portion;
   dissolving the polymer leaving the patterned gate electrode over the top portion.

9. The method of claim 6, wherein forming the distinct sacrificial layer comprises:
   forming a second distinct sacrificial layer;
   forming a third distinct sacrificial layer.

10. The method of claim 9, wherein forming the second distinct sacrificial layer comprise:
    depositing a planarization layer;
    depositing a channel layer;
    dissolving the planarization layer.

11. The method of claim 9, wherein forming a second sacrificial layer comprises:
    depositing the second distinct sacrificial layer;
    planarizing and etching the second sacrificial layer;
    etching the second distinct sacrificial layer and removing first planarization layer;
    depositing a channel layer;
    dissolving the second distinct sacrificial layer.

12. The method of claim 9, wherein forming a third distinct sacrificial layer comprises:

depositing the third distinct sacrificial layer;
planarizing and etching the third distinct sacrificial layer;
removing second planarization layer;
planarizing and etching;
depositing a fourth distinct sacrificial layer.

13. The method of claim 1, wherein the substrate is transparent and the conductive layer is transparent; and comprises INSnO.

14. The method of claim 1, wherein the channel material comprises ZnO.

15. The method of claim 1, wherein effectively no portion of the distinct sacrificial layer remains as part of the formed thin film device.

16. The method of claim 1, wherein the distinct sacrificial layer is not a sub-portion of at least one other thin film device layer providing an element remaining as part of the formed thin film device.

17. A system for fabricating a transparent thin film transistor over a flexible substrate comprising:
    means for depositing an imprintable material over the flexible substrate;
    means for stamping the imprintable material forming a three-dimensional pattern in the imprintable material;
    means for forming a distinct sacrificial layer over the three-dimensional pattern; and
    means for depositing a conductive layer over the distinct sacrificial layer; and means for dissolving effectively all of the distinct sacrificial layer, leaving portions of the conductive layer as defined by the three-dimensional pattern;
    means for depositing a gate layer over the substrate;
    means for depositing a gate dielectric over the gate layer; and
    means for depositing a channel material over the gate dielectric.

18. A method of forming a thin film device on a substrate, comprising:
    depositing an imprintable material over the substrate;
    stamping the imprintable material forming a three-dimensional pattern in the imprintable material;
    forming a distinct sacrificial layer over the three-dimensional pattern;
    depositing a etch-resistant conductive layer over the distinct sacrificial layer;
    removing effectively all of the distinct sacrificial layer, leaving portions of the etch-resistant conductive layer as thin film device conductors as defined by the three-dimensional pattern;
    depositing a gate layer over the substrate;
    depositing a gate dielectric over the gate layer; and
    depositing a channel material over the gate dielectric.

19. A method of forming a thin film device on a substrate, comprising:
    depositing at least one thin film device layer upon the substrate;
    depositing an imprintable material over the at least one thin film device layer
    stamping the imprintable material forming a three-dimensional patterin in the imprintable material;
    forming a distinct sacrificial layer over the three-dimensional pattern, the distinct sacrificial layer a separate structure form the at least one thin film device layer;
    depositing a conductive layer over the distinct sacrificial layer; and
    removing effectively all of the distinct sacrificial layer, leaving portions of the conductive layer as defined by the three-dimensional pattern;
    depositing a gate layer over the substrate;
    depositing a gate dielectric over the gate layer; and
    depositing a channel material over the gate dielectric.

* * * * *

UNITED STATES PATENT AND TRADEMARK OFFICE
CERTIFICATE OF CORRECTION

PATENT NO. : 7,678,626 B2  Page 1 of 2
APPLICATION NO. : 11/285879
DATED : March 16, 2010
INVENTOR(S) : Craig M. Perlov et al.

It is certified that error appears in the above-identified patent and that said Letters Patent is hereby corrected as shown below:

In column 8, line 2, in Claim 1, delete "pattern;" and insert -- pattern and substrate; --, therefor.

In column 8, line 5, in Claim 1, after "removing" insert -- effectively all of --.

In column 8, line 11, in Claim 2, delete "claim 1" and insert -- claim 1, --, therefor.

In column 8, lines 20-25, in Claim 4, delete
"4. The method of claim 1, wherein forming a distinct sacrificial layer comprises:
   applying spin on glass over the three-dimensional pattern;
   thinning the glass; etching the glass and
   imprintable material according to the three-dimensional
      pattern."
and insert
-- 4. The method of claim 1, wherein forming a distinct sacrificial layer comprises:
   applying spin on glass over the three-dimensional pattern;
   thinning the glass;
   etching the glass and imprintable material according to the
      three-dimensional pattern. --, therefor.

In column 8, lines 26-32, in Claim 5, delete
"5. The method of claim 1, wherein forming a distinct sacrificial layer comprises:
   depositing a polymer over the three-dimensional pattern;
   applying spin on glass over the polymer;
   thinning the glass; etching the polymer and
   imprintable material according to the three-dimensional
      pattern."
and insert Signed and Sealed this Twenty-second Day of June, 2010

David J. Kappos
*Director of the United States Patent and Trademark Office*

-- 5. The method of claim 1, wherein forming a distinct sacrificial layer comprises:
    depositing a polymer over the three-dimensional pattern;
    applying spin on glass over the polymer;
    thinning the glass;
    etching the polymer and imprintable material according to
        the three-dimensional pattern. --, therefor.

In column 8, line 54, in Claim 10, delete "comprise:" and insert -- comprises: --, therefor.

In column 8, line 58, in Claim 11, after "second" insert -- distinct --.

In column 8, line 61, in Claim 11, after "second" insert -- distinct --.

In column 9, line 8, in Claim 13, delete "INSnO." and insert -- InSnO. --, therefor.

In column 9, line 26, in Claim 17, delete "pattern; and" and insert -- pattern and substrate; --, therefor.

In column 10, line 6, in Claim 18, after "over" insert -- about all of --.

In column 10, line 24, in Claim 19, delete "patterin" and insert -- pattern --, therefor.

In column 10, line 27, in Claim 19, delete "form" and insert -- from --, therefor.